US012765130B2

(12) United States Patent
Kopp et al.

(10) Patent No.: US 12,765,130 B2
(45) Date of Patent: Oct. 13, 2026

(54) RADIATION-EMITTING SEMICONDUCTOR CHIP AND METHOD FOR PRODUCING A RADIATION-EMITTING SEMICONDUCTOR CHIP

(71) Applicant: ams-OSRAM International GmbH, Regensburg (DE)

(72) Inventors: Fabian Kopp, Tanjung Tokong (MY); Attila Molnar, Gelugor (MY); Hong Pin Loh, Bayan Lepas (MY); Ban Loong Chris Ng, Ayer Itam (MY)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 455 days.

(21) Appl. No.: 18/260,621

(22) PCT Filed: Jan. 19, 2021

(86) PCT No.: PCT/EP2021/051042

§ 371 (c)(1),
(2) Date: Jul. 7, 2023

(87) PCT Pub. No.: WO2022/156879

PCT Pub. Date: Jul. 28, 2022

(65) Prior Publication Data

US 2024/0063345 A1 Feb. 22, 2024

(51) Int. Cl.
*H10H 20/84* (2025.01)
*H10H 20/841* (2025.01)
(Continued)

(52) U.S. Cl.
CPC .......... *H10H 20/841* (2025.01); *H10W 90/00* (2026.01); *H10H 20/034* (2025.01)

(58) Field of Classification Search
CPC ... H10H 20/00–882; H10H 29/00–142; H10H 29/30–962; H10H 20/841; H10H 20/034; H01L 25/0753
See application file for complete search history.

(56) References Cited

U.S. PATENT DOCUMENTS 9,466,765 B1 * 10/2016 Yoon .................. H10H 20/0137
2011/0297979 A1 12/2011 Diana et al.
(Continued)

FOREIGN PATENT DOCUMENTS

EP 2782149 A2 9/2014
WO 2020159068 A1 8/2020

OTHER PUBLICATIONS

International Search Report issued for the corresponding International patent application No. PCT/EP2021/051042, dated Oct. 13, 2021, 3 pages (for informational purposes only).

*Primary Examiner* — Ismail A Muse
(74) *Attorney, Agent, or Firm* — VIERING, JENTSCHURA & PARTNER MBB

(57) ABSTRACT

A radiation-emitting semiconductor chip may include a semiconductor layer sequence having a first semiconductor layer of a first doping type and a second semiconductor layer of a second doping type. The chip may also include a first dielectric layer and a second dielectric layer arranged on the semiconductor layer sequence. A first recess may be arranged in the semiconductor layer sequence in a border region of the radiation-emitting semiconductor chip completely penetrating the first semiconductor layer. The first dielectric layer may cover the semiconductor layer sequence in the border region completely. The border region may be free of the second dielectric layer in an edge region. In addition, a method is disclosed for producing a radiation-emitting semiconductor chip.

15 Claims, 3 Drawing Sheets

(51) Int. Cl.
*H10W 90/00* (2026.01)
*H10H 20/01* (2025.01)

(56) References Cited

U.S. PATENT DOCUMENTS

| | | | | |
|---|---|---|---|---|
| 2014/0225143 | A1* | 8/2014 | Kususe | H01L 24/96 257/98 |
| 2016/0056118 | A1* | 2/2016 | Yoon | H10H 20/84 257/737 |
| 2016/0149086 | A1 | 5/2016 | Sim | |
| 2017/0108173 | A1* | 4/2017 | Kim | H10H 20/831 |
| 2017/0133549 | A1 | 5/2017 | Xu et al. | |
| 2017/0373228 | A1 | 12/2017 | Chang et al. | |
| 2018/0351042 | A1* | 12/2018 | Jang | H10H 20/857 |
| 2019/0131503 | A1* | 5/2019 | Yahata | H10H 20/833 |
| 2019/0165216 | A1* | 5/2019 | Kang | H10H 20/841 |
| 2019/0273187 | A1* | 9/2019 | Yoon | H10H 20/833 |
| 2020/0020739 | A1* | 1/2020 | Chen | H10H 20/821 |
| 2020/0357955 | A1* | 11/2020 | Chuang | H10H 20/8314 |
| 2021/0359188 | A1 | 11/2021 | Kim et al. | |
| 2022/0328728 | A1* | 10/2022 | Check | H10H 20/856 |

* cited by examiner

RADIATION-EMITTING SEMICONDUCTOR CHIP AND METHOD FOR PRODUCING A RADIATION-EMITTING SEMICONDUCTOR CHIP

CROSS-REFERENCE TO RELATED APPLICATION

The present application is a national stage entry according to 35 U.S.C. § 371 of PCT application No.: PCT/EP2021/051042 filed on Jan. 19, 2021, which is incorporated herein by reference in their entirety and for all purposes.

TECHNICAL FIELD

A radiation-emitting semiconductor chip is provided. Furthermore, a method for producing a radiation-emitting semiconductor chip is provided.

BACKGROUND

It is an objective to provide a radiation-emitting semiconductor chip having an improved reliability. Additionally, a method for producing such a radiation-emitting semiconductor chip is provided.

SUMMARY

The radiation-emitting semiconductor chip is configured, for example, to emit electromagnetic radiation during operation such as ultraviolet radiation, i.e. UV-C radiation, visible radiation and/or infrared radiation. The visible radiation is formed, for example, of blue light, green light, yellow light and/or red light.

The radiation-emitting semiconductor chip has, for example, a main plane of extension. A vertical direction extends perpendicular to the main plane of extension and lateral directions extend parallel to the main plane of extension.

According to at least one embodiment, the radiation-emitting semiconductor chip comprises a semiconductor layer sequence comprising a first semiconductor layer of a first doping type and a second semiconductor layer of a second doping type. For example, the semiconductor layer sequence is produced by an epitaxial growth process. Exemplarily, the first semiconductor layer and the second semiconductor layer are epitaxially grown on top of one another in vertical direction. The semiconductor layer sequence is grown, for example, on a growth substrate comprising or consisting of sapphire.

For example, the first doping type is different from the second doping type. The first semiconductor layer is, e.g., p-doped. Furthermore, the second semiconductor layer is, e.g., n-doped. In this case, the first doping type is a p-doping type and the second doping type is an n-doping type. Alternatively, the first semiconductor layer is n-doped and the second semiconductor layer is p-doped.

The semiconductor layer sequence is, for example, formed of a III-V compound semiconductor. The III-V compound semiconductor is, for example, an arsenide compound semiconductor, a nitride compound semiconductor or a phosphide compound semiconductor. In particular, the semiconductor layer sequence is based on AlInGaN.

For example, an active region is arranged between the first semiconductor layer and the second semiconductor layer. The active region is exemplarily configured to generate electromagnetic radiation.

According to at least one embodiment, the radiation-emitting semiconductor chip comprises a first dielectric layer and a second dielectric layer arranged on the semiconductor layer sequence. For example, the semiconductor layer sequence, the second dielectric layer and the first dielectric layer are stacked above one another in vertical direction, exemplarily in the order indicated.

The first dielectric layer, for example, covers a main surface of the first semiconductor layer facing away from the second semiconductor layer. Furthermore, for example, the first dielectric layer completely covers an outer surface of the second dielectric layer facing away from the semiconductor layer sequence.

For example, the first dielectric layer and/or the second dielectric layer are formed of a dielectric material being electrically insulating. The first dielectric layer and/or the second dielectric layer, for example, comprise one or more or consist of one of the following dielectric materials: $SiO_2$, $Al_2O_3$, $TiO_2$, $Ta_2O_5$, $Nb_2O_5$, NbF, $Si_3N_4$, $Si_2ON_2$, $MgF_2$.

The first dielectric layer is, for example, an encapsulation layer. In this case, the first dielectric layer comprises or consists of $SiO_2$.

The first dielectric layer has, for example, a thickness in vertical direction of at least 100 nm and at most 500 nm. Exemplarily, the thickness of the first dielectric layer is about 300 nm.

For example, the second dielectric layer is configured to be reflective for electromagnetic radiation generated by the active region. The second dielectric layer exemplarily has a reflection of at least 98%, in particular at least 99%, for the electromagnetic radiation generated in the active region.

The second dielectric layer has, for example, a thickness in vertical direction of at least 500 nm and at most 5 μm. Exemplarily, the thickness of the second dielectric layer is about 1 μm.

According to at least one embodiment of the radiation-emitting semiconductor chip, a first recess is arranged in the semiconductor layer sequence in a border region of the radiation-emitting semiconductor chip completely penetrating the first semiconductor layer. For example, the first recess completely penetrates the first semiconductor layer and the active region and extends in vertical direction at least partially into the second semiconductor layer. For example, the first recess penetrates the second semiconductor layer only partially such that a bottom surface of the first recess is formed of the second semiconductor layer. Alternatively, the first recess completely penetrates the second semiconductor layer such that the bottom surface of the first recess is formed of the substrate.

At least one side surface of the first recess is formed exemplarily of the first semiconductor layer and the second semiconductor layer. For example, the side surface of the first recess is inclined to the main extension plane. The side surface of the first recess encloses, for example, an angle of at least 30° and at most 90° with the main extension plane, i.e. about 45°.

An extension of the border region in lateral directions is defined, for example, by the first recess. The border region extends from at least one side surface of the radiation-emitting semiconductor chip, in particular from all of the side surfaces of the radiation-emitting semiconductor chip, in lateral directions to a center of the radiation-emitting semiconductor chip up to an edge of the first recess. The extension of the border region is, for example, at least 5 μm and at most 500 μm.

Further, the border region completely surrounds, for example, the active region in lateral directions. This is to say that the border region encloses the active region in lateral directions in a frame-like manner. Since the border region completely surrounds the active region, the first recess exemplary completely surrounds the active region in lateral directions. A region of the radiation-emitting semiconductor chip being surrounded by the border region is referred to a main region comprising the active region and extending up to the border region.

According to at least one embodiment of the radiation-emitting semiconductor chip, the first dielectric layer completely covers the semiconductor layer sequence in the border region. For example, in plan view, the first dielectric layer and the semiconductor layer sequence completely overlap. For example, the bottom surface of the first recess is completely covered by the first dielectric layer. Exemplary, the first dielectric layer is not removed in any region in the border region.

According to at least one embodiment of the radiation-emitting semiconductor chip, the border region is free of the second dielectric layer in an edge region. The edge region is part of the border region and extends from the side surface of the radiation-emitting semiconductor chip in lateral directions to the center of the radiation-emitting semiconductor chip. An extension of the edge region in direction to the center is, for example, smaller than the extension of the border region. The extension of the edge region is, for example, at least two times smaller than the extension of the border region in lateral directions. The extension of the edge region is, for example, at least 500 nm and at most 50 μm.

For example, in plan view the semiconductor layer sequence does not overlap with the second dielectric layer in the edge region. Exemplarily, the bottom surface of the first recess is not completely covered by the second dielectric layer. This is to say that the second dielectric layer is removed in the edge region, for example.

According to an embodiment, the radiation-emitting semiconductor chip comprises a semiconductor layer sequence comprising a first semiconductor layer of a first doping type and a second semiconductor layer of a second doping type, and a first dielectric layer and a second dielectric layer arranged on the semiconductor layer sequence. Further, a first recess is arranged in the semiconductor layer sequence in a border region of the radiation-emitting semiconductor chip completely penetrating the first semiconductor layer. In addition the first dielectric layer completely covers the semiconductor layer sequence in the border region, and the border region is free of the second dielectric layer in an edge region.

One idea of the radiation-emitting semiconductor chip described herein is, inter alia, to have an edge region of the radiation-emitting semiconductor chip being free of the second dielectric layer. This is to say that a common thickness of the dielectric layers in the edge region is effectively reduced in comparison to a radiation-emitting semiconductor chip, wherein all dielectric layers are present in the edge region. Such a common thickness reduction prevents advantageously a chipping of the dielectric layers during a separation process in the edge region. Therefore, such a radiation-emitting semiconductor chip is advantageously reliable since no impurities can enter the radiation-emitting semiconductor chip through a chipped region.

According to at least one embodiment of the radiation-emitting semiconductor chip, the semiconductor layer sequence is configured to emit electromagnetic radiation from a radiation exit surface. For example, the radiation exit surface of the semiconductor layer sequence is formed of a main surface of the second semiconductor layer facing away from the first semiconductor layer.

According to at least one embodiment of the radiation-emitting semiconductor chip, the first dielectric layer and the second dielectric layer are arranged opposite the radiation exit surface. Exemplarily, the second dielectric layer is configured to redirect electromagnetic radiation in direction to the radiation exit surface.

According to at least one embodiment of the radiation-emitting semiconductor chip, a third dielectric layer is arranged between the second dielectric layer and the semiconductor layer sequence. For example, the semiconductor layer sequence, the third dielectric layer, the second dielectric layer and the first dielectric layer are stacked above one another in vertical direction, exemplarily in the order indicated.

The third dielectric layer, for example, covers the main surface of the first semiconductor layer facing away from the second semiconductor layer. For example, the first dielectric layer and the third dielectric layer completely encapsulate the second dielectric layer, in particular three dimensionally.

Further, the third dielectric layer is in direct contact to the semiconductor layer sequence, for example. Exemplary, the third dielectric layer is in direct contact to the first semiconductor layer in the main region. In addition, the third dielectric layer is in direct contact to the bottom surface of the first recess and the side surface of the first recess.

For example, the third dielectric layer is formed of a dielectric material being electrically insulating. The third dielectric layer, for example, comprises or consists of one of the following dielectric materials: $SiO_2$, $Al_2O_3$, $TiO_2$, $Ta_2O_5$, $Nb_2O_5$, NbF, $Si_3N_4$, $Si_2ON_2$, $MgF_2$.

The third dielectric layer is, for example, a passivation layer. In this case, the third dielectric layer comprises or consists of $Al_2O_3$. Advantageously, due to the use of the passivation layer and the encapsulation layer, the first and the third dielectric layers of the radiation-emitting semiconductor chip form in particular a moisture-proofed barrier. Thus, the semiconductor layer sequence is in particular well protected against moisture.

The third dielectric layer has, for example, a thickness in vertical direction of at least 5 nm and at most 300 nm. For example, the thickness of the third dielectric layer is about 100 nm.

For example, the third dielectric layer is produced by an atomic layer deposition, ALD for short, process.

According to at least one embodiment of the radiation-emitting semiconductor chip, the third dielectric layer is in direct contact to the first dielectric layer in the edge region. For example, since the edge region is free of the second dielectric layer, the second dielectric layer is not arranged between the third dielectric layer and the first dielectric layer in the edge region.

In the main region and in the border region excluding the edge region, for example, the third dielectric layer is in direct contact to the second dielectric layer and the second dielectric layer is in direct contact to the first dielectric layer.

According to at least one embodiment of the radiation-emitting semiconductor chip, the second dielectric layer is a distributed Bragg reflector. Exemplarily, the second dielectric layer comprises a plurality of sublayers. This is to say that the distributed Bragg reflector comprises alternating sublayers of a high refractive index material and a low refractive index material. The sublayers, for example, comprise $SiO_2$, $Al_2O_3$, $TiO_2$, $Ta_2O_5$, $Nb_2O_5$, NbF, Silicon Nitride, $Si_2ON_2$, $MgF_2$.

Since the second dielectric layer is not present in the edge region, a chipping of the distributed Bragg reflector during a separation process in the edge region is advantageously suppressed.

According to at least one embodiment of the radiation-emitting semiconductor chip, the first dielectric layer and the third dielectric layer have a combined thickness of at most 3 μm. In particular, the first dielectric layer and the third dielectric layer in the edge region, being free of the second dielectric layer, have a combined thickness of at most 1 μm, exemplary at most 500 nm. This is to say that all dielectric layers, arranged in the edge region do not exceed a combined thickness of at most 3 μm.

Due to such a combined thickness, the radiation-emitting semiconductor chip can advantageously be separated particularly easy during a separation process.

According to at least one embodiment of the radiation-emitting semiconductor chip, the semiconductor layer sequence is arranged on a substrate. For example, the substrate is the growth substrate for the semiconductor layer sequence. The substrate is formed, exemplarily, of sapphire.

According to at least one embodiment of the radiation-emitting semiconductor chip, the substrate has a structured main surface. For example, the structured main surface of the substrate faces the main surface of the semiconductor layer sequence being formed as the radiation exit surface. This is to say that exemplarily also the radiation exit surface is structured according to the structured main surface of the substrate.

For example, the structured main surface comprises a plurality of structure elements. The structure elements are formed, e.g., of projections having an extension in vertical direction. The extension in vertical direction of the projections is exemplarily at most 2 μm.

Advantageously, such a structured main surface increases an extraction of the electromagnetic radiation out of the radiation-emitting semiconductor chip.

According to at least one embodiment of the radiation-emitting semiconductor chip, a second recess is arranged in the first recess completely penetrating the second semiconductor layer. Exemplarily, an extension of the second recess in lateral directions is smaller than an extension of the first recess in lateral directions. For example, the second recess completely penetrates the second semiconductor layer such that a bottom surface of the second recess is formed of the substrate. At least one side surface of the second recess is formed exemplarily of the second semiconductor layer. For example, the side surface of the second recess is inclined to the main extension plane. The side surface of the second recess encloses, for example, an angle of at least 30° and at most 90° with the main extension plane, i.e. about 45°.

Advantageously, having such a second recess, the radiation-emitting semiconductor chip can be generated by a separation process through the edge region more easily since there is no material of the semiconductor layer sequence to be separated.

According to at least one embodiment of the radiation-emitting semiconductor chip, a side surface of the second dielectric layer is inclined with respect to a main extension plane of the radiation-emitting semiconductor chip. For example, the side surface of the second dielectric layer encloses, for example, an angle of at least 45° and at most 80° with the main extension plane, i.e. about 60°.

According to at least one embodiment of the radiation-emitting semiconductor chip, the second dielectric layer comprises a plurality of sublayers and layer thicknesses of the sublayers are tapered in the border region in direction to the edge region. Exemplary, in the border region close to the edge region each of the sublayers extend along a main extension direction being inclined to the main extension plane. For example, each thickness is defined perpendicular a corresponding main extension direction of the sublayers.

According to at least one embodiment of the radiation-emitting semiconductor chip, the second dielectric layer comprises a plurality of sublayers and layer thicknesses of the sublayers in the border region are constant in direction to the edge region. Exemplary, each of the sublayers extend in lateral directions.

According to at least one embodiment of the radiation-emitting semiconductor chip, the radiation-emitting semiconductor chip is a flip chip.

For example, the radiation-emitting semiconductor chip is provided in the main region with at least two contacts configured to be externally electrically contactable. The contacts comprises or consists, for example, of a metal. The contacts are in electrical contact with the semiconductor layer sequence and are configured to provide power to the semiconductor layer sequence.

The first dielectric layer, the second dielectric layer and/or the third dielectric layer are not arranged in regions on the semiconductor layer sequence, where the contacts are in direct electrical contact with the semiconductor layer sequence.

In addition, a method for producing a radiation-emitting semiconductor chip is provided. In particular, the radiation-emitting semiconductor chip described herein above can be produced with the method. Therefore, all features disclosed in connection with the radiation-emitting semiconductor chip are also disclosed in connection with the method and vice versa.

According to at least one embodiment of the method, a semiconductor wafer having a first semiconductor wafer layer of the first doping type and a second semiconductor wafer layer of a second doping type is provided. For example, the semiconductor wafer is formed of the same materials than the semiconductor layer sequence.

According to at least one embodiment of the method, a first separation recess is produced within the semiconductor wafer in a separation region completely penetrating the first semiconductor wafer layer. For example, the first separation recess is produced by a dry etching process or a wet etching process.

The separation region is exemplary a region, where the semiconductor wafer layer is intended to be separated. Further, the first separation recess defines an extension of the separation region.

Advantageously, a semiconductor wafer having such a first separation recess can be better separated through the first separation recess since a common thickness of the semiconductor wafer is reduced within the first separation recess.

According to at least one embodiment of the method, a first dielectric layer is applied on the semiconductor wafer such that the first dielectric layer completely covers the semiconductor wafer in the separation region. For example, the first dielectric layer is applied by at least one of the following processes: chemical vapour deposition (CVD for short), physical vapour deposition (PVD for short), atomic layer deposition (ALD for short), sputtering.

According to at least one embodiment of the method, a second dielectric layer is applied on the semiconductor wafer such that the separation region is free of the second dielectric layer in a central region. Exemplarily, the first dielectric layer is applied by a PVD process such as sputtering or a CVD process or using a sol-gel method.

For example, the central region has an extension in lateral directions being smaller than the separation region. The central region is, for example, arranged in a centre of the separation region. This is to say that the central region is spaced apart in lateral directions from two opposite side surfaces of the first separation recess.

In particular, the second dielectric layer is applied on the semiconductor wafer before the application of the first dielectric layer.

According to at least one embodiment of the method, the semiconductor wafer is separated through the central region into radiation-emitting semiconductor chips. For example, by the separation process, the semiconductor wafer is separated into at least two radiation-emitting semiconductor chips each being a radiation-emitting semiconductor chip described herein before.

If the semiconductor wafer further comprises a second separation recess within the first separation recess exposing the substrate, the arrangement is exemplarily separated through the exposed substrate into at least two radiation-emitting semiconductor chips by the separation process.

The separating process can comprise a scribing process in combination with a breaking process, a mechanical sawing process or a laser cutting process.

In particular, the separation region is separated by the separation process in two of the border regions each having the edge region being free of the second dielectric layer.

Advantageously, due to such a separation region a chipping of the second dielectric layer, being in particular formed of the distributed Bragg reflector, can effectively be reduced.

According to at least one embodiment of the method, the second dielectric layer is applied on the separation region completely, and the second dielectric layer is removed from the separation region in the central region. Exemplarily, the second dielectric layer is initially applied on the whole semiconductor wafer. Subsequently, the second dielectric layer is completely removed from the central region, for example.

According to at least one embodiment of the method, the second dielectric layer is removed from the separation region in the central region by an etching process. In particular, the sublayers are removed from the separation region in the central region by an etching process.

With such an etching process, each thickness of the sublayers in the border region is constant in direction to the central region in lateral directions.

According to at least one embodiment of the method, the second dielectric layer is removed by a lift-off process. For example, the second dielectric layer, in particular the sublayers, are applied on the semiconductor wafer by a deposition method using a mask.

For example, the mask exemplarily comprises at least one opening, wherein the opening is located above the separation region except the central region. This is to say that the mask shades the central region. During application of a material of the second dielectric layer, the material of each sublayer is deposited on the mask shading the central region as well as on the separation region except the central region, for example. After the application of the material of the sublayers, the mask is exemplarily removed such that the sublayers are solely present in the separation region except the central region.

It is possible that the material of the sublayers is not applied isotropic below an edge region of the opening of the mask, for example. This is to say that due to the mask, each layer thickness of the sublayers in the separation region close to the central region is tapered in direction to the central region.

According to at least one embodiment of the method, the semiconductor wafer is separated by a stealth dicing process. The stealth dicing process comprises, for example, two stages. In a first stage, a defect region is initially introduced in vertical direction into the semiconductor wafer along at least one intended separation line, for example. The introduction of the defect region is exemplarily carried out by a laser beam. Subsequently, in a second stage, the wafer is subjected to a force in lateral directions and/or vertical direction in order to induce a breaking of the semiconductor wafer along the defect region.

BRIEF DESCRIPTION OF THE DRAWINGS

The radiation-emitting semiconductor chip and the method for producing a radiation-emitting semiconductor chip described herein are explained in greater detail below with reference to exemplary embodiments and the associated Figures.

Identical, similar or identically acting elements are provided with the same reference signs in the Figures. The Figures and the size ratios of the elements represented in the Figures among one another are not drawn to scale. Rather, individual elements, in particular layer thicknesses, can be represented exaggeratedly large for better illustration and/or for better comprehension.

DETAILED DESCRIPTION

Figure 1:
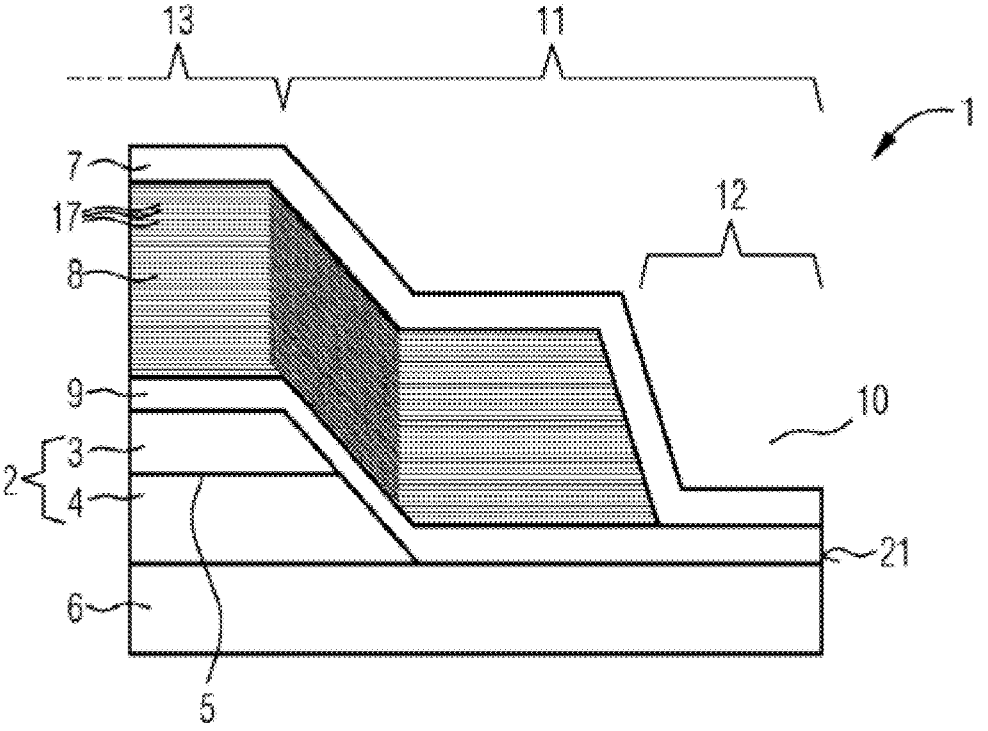
FIGS. 1 and 2 each shows a schematic sectional view of a radiation-emitting semiconductor chip according to an exemplary embodiment.

The radiation-emitting semiconductor chip 1 according to the exemplary embodiment of FIG. 1 comprises a semiconductor layer sequence 2 comprising a first semiconductor layer 3 of a first doping type and a second semiconductor layer 4 of a second doping type being different from the first doping. Further, an active region 5 is arranged between the first semiconductor layer 3 and the second semiconductor layer 4. The semiconductor layer sequence 2 is arranged on a substrate 6 being a growth substrate for the semiconductor layer sequence 2. For example, the first semiconductor layer 3 is of a p-doping type and the second semiconductor layer 4 is of an n-doping type. Exemplarily, the semiconductor layer sequence 2 is based on an AlInGaN material.

Figure 5:
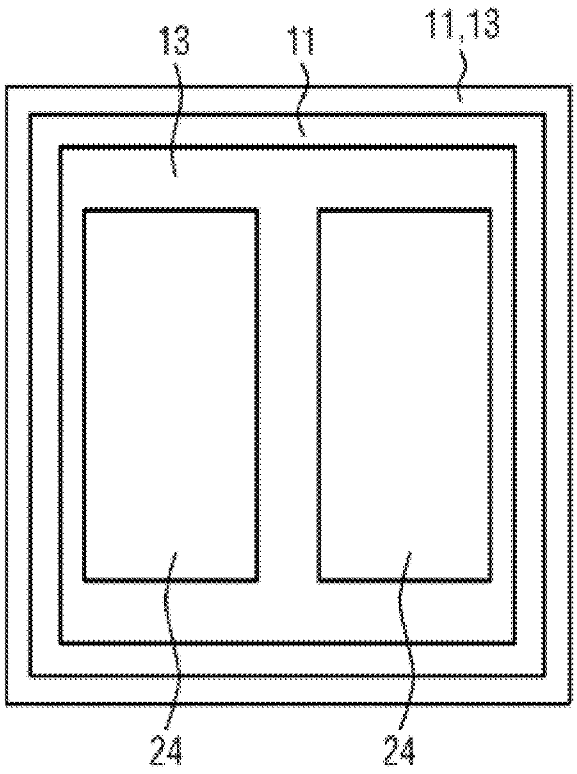
FIG. 5 shows a schematic plan view of a radiation-emitting semiconductor chip according to an exemplary embodiment.

In plan view, the radiation-emitting semiconductor chip 1 is divided in a border region 11 and a main region 13. The border region 11 completely surrounds the main region 13 in lateral directions, as shown in FIG. 5. Further, the border region 11 extends from a side surface of the radiation-emitting semiconductor chip 21 in lateral directions in direction to a centre of the radiation-emitting semiconductor chip 1. In addition, the border region 11 comprises an edge region 12, extending from the side surface of the radiation-emitting semiconductor chip 21 in lateral directions in direction to the centre of the radiation-emitting semiconductor chip 1. An extension of the edge region 12 is smaller than an extend of the border region 11.

The semiconductor layer sequence 2 comprises a first recess in the border region 11. It is possible that the first recess 10 defines an extend of the border region 11 in lateral directions. The first recess 10 completely penetrates the first semiconductor layer 3, the active region 5 and the second semiconductor layer 4 such that a bottom surface of the first recess 10 is formed of the substrate 6.

Further, a side surface of the first recess 10 is formed of the first semiconductor layer 3 and the second semiconductor layer 4. The side surface of the first recess 10 facing the substrate 6 encloses, for example, an angle of about 45° with a main extension plane of the radiation-emitting semiconductor chip 1. The edge region 12 is spaced apart in lateral directions from the side surface of the first recess 10.

A first dielectric layer 7, a second dielectric layer 8 and a third dielectric 9 layer are arranged on the semiconductor layer sequence 2.

The first dielectric layer 7 covers the semiconductor layer sequence 2 in the main region 13 and in the border region 11. Further, the second dielectric layer 8 is arranged between the first dielectric layer 7 and the third dielectric layer 9. In the main region 13, the first dielectric layer 7 is in direct contact to the second dielectric layer 8. Further, in the edge region 12, the first dielectric layer 7 is in direct contact with the third dielectric layer 9. In the border region 11, which is not the edge region 12, the second dielectric layer 8 is in direct contact with the first dielectric layer 7.

The first dielectric layer 7 is, e.g., an encapsulation layer and is formed of $SiO_2$ having a thickness of about 300 nm.

The third dielectric layer 9 covers the semiconductor layer sequence 2 in the main region 13 and in the border region 11. In the main region 13, the third dielectric layer 9 is in direct contact to the first semiconductor layer 3. In the border region 11, the third dielectric layer 9 is in direct contact with the side surface of the first recess 10 and the bottom surface of the first recess 10. This is to say that the third dielectric layer 9 is in direct contact to the first semiconductor layer 3 and the second semiconductor layer 4 as well as to the substrate 6 in the border region 11.

The third dielectric layer 9 is, e.g., a passivation layer and is formed of $Al_2O_3$ having a thickness of about 100 nm. The first dielectric layer 7 and the third dielectric layer 9 have a common thickness of, e.g., 400 nm in the edge region 12 directly adjacent to the side surface of the radiation-emitting semiconductor chip 21.

The second dielectric layer 8 is completely encapsulated by the first dielectric layer 7 and the third dielectric layer 9 in a three dimensional manner. Further, the second dielectric layer 8 is not arranged in the edge region 12. This is to say in plan view, the second dielectric layer 8 and the edge region 12 have no overlap with one another.

The second dielectric layer 8 comprises a plurality of sublayers 17, wherein the sublayers 17 are stacked above one another in an alternating manner with a high refractive index material and a low refractive index material. In this case the second dielectric layer 8 is a distributed Bragg reflector.

The second dielectric layer 8 comprises a side surface enclosing, for example, an angle of about 60° with a main the extension plane of the radiation-emitting semiconductor chip 1. In this embodiment, each of the sublayers 17 of the second dielectric layer 8 have a constant thickness in the border region 11 in direction to the edge region 12. Further, each of the sublayers 17 of the second dielectric layer 8 extend in lateral directions.

Figure 2:
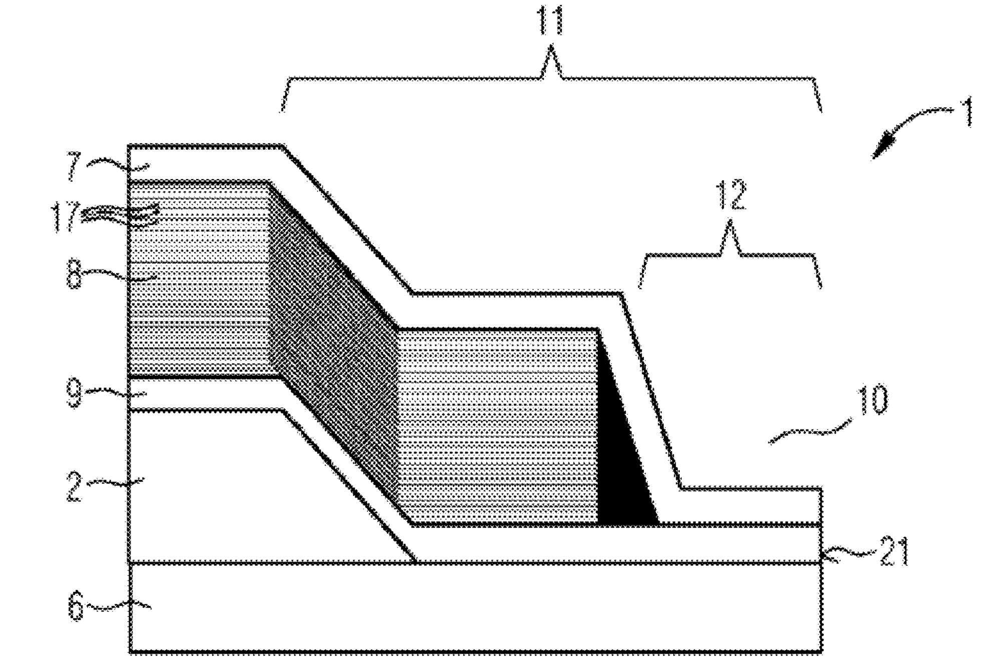

The radiation-emitting semiconductor chip 1 according to the exemplary embodiment of FIG. 2 has, in contrast to FIG. 2, a second dielectric layer 8 with sublayers 17 having a tapering thickness. Each thickness of the sublayers 17 tapers in the border region 11 in direction to the edge region 12 close to the edge region 12. In this embodiment, each thickness is defined being perpendicular to the main extension direction of each sublayer 17, in particular in a region of the side surface of the second dielectric layer 8.

Figure 3:
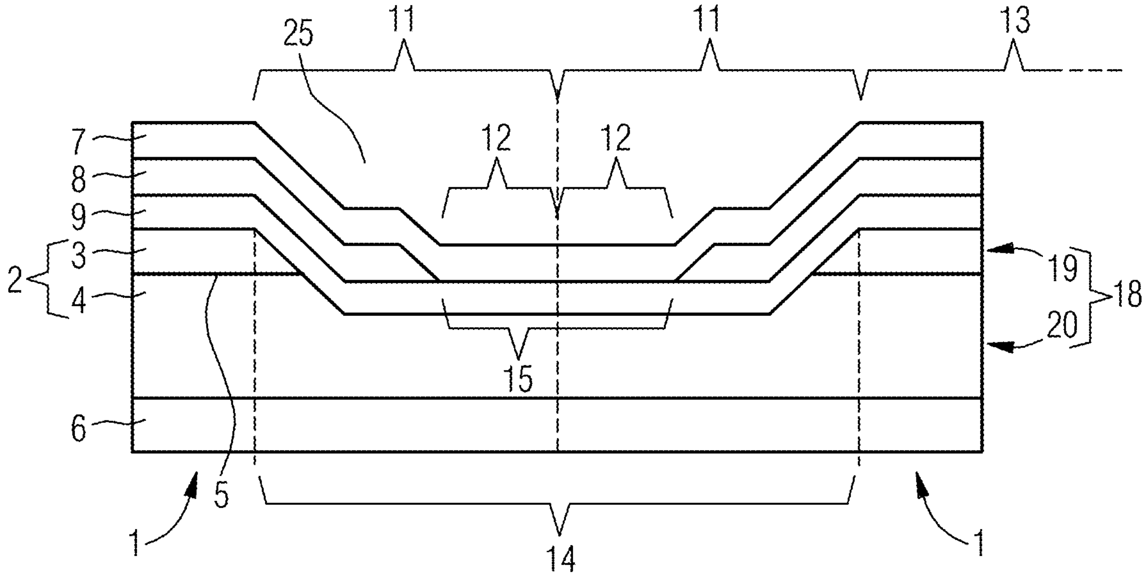
FIGS. 3 and 4 each shows a method stage for producing a radiation-emitting semiconductor chip according to an exemplary embodiment.

In the method stage according to FIG. 3 a semiconductor wafer comprising a first semiconductor wafer layer 19 and a second semiconductor wafer layer is separated in vertical direction into two radiation-emitting semiconductor chips 1 according to an exemplary embodiment. The semiconductor wafer is separated along the dashed line indicated in FIG. 3.

Prior to the separation step, the semiconductor wafer 18 is provided and a first separation recess 25 is produced within the semiconductor wafer 18 in a separation region 14. The first separation recess 25 completely penetrates the first semiconductor wafer layer 19 and extends in vertical direction at least partially into the second wafer semiconductor layer. This is to say that a bottom surface of the first separation recess 25 is formed of the second semiconductor wafer layer 20. Exemplarily, an extend in lateral directions of a separation region 14 is defined by the first separation recess 25.

Subsequently, the first dielectric layer 7, the second dielectric layer 8 and the third dielectric layer 9 are applied on the semiconductor wafer. The first dielectric layer 7 and the third dielectric layer 9 are applied on the semiconductor wafer 18 such that the first dielectric layer 7 and the third dielectric layer 9 completely covers the semiconductor wafer 18 in the separation region 14.

The second dielectric layer 8 is applied in such a way that a central region 15 of the separation region 14 is free of the second dielectric layer 8. This is to say that a common thickness of the dielectric layers is effectively reduced in the central region 15.

Finally, the semiconductor wafer 18 is separated along the dashed line by a stealth dicing process.

Figure 4:
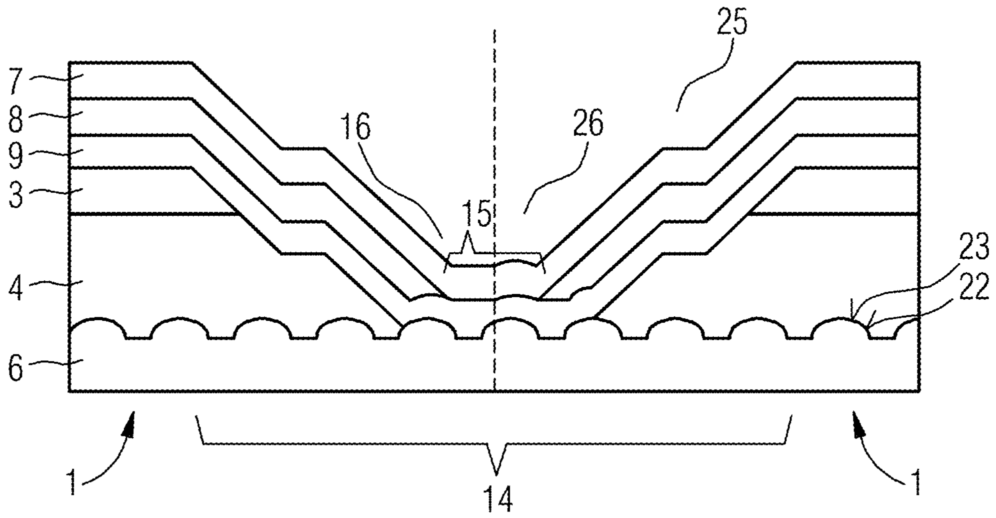

In the method stage according to FIG. 4, a second separation recess 26 is produced within the semiconductor wafer 18 in a separation region 14, in addition to the first separation recess 25 according to FIG. 3. The second separation recess 26 completely penetrates the second semiconductor wafer layer such that a bottom surface of the second separation recess 26 is formed of the substrate 6. Further, the second separation recess 26 has a smaller extension in lateral directions than the first separation recess 25.

A side surface of the second separation recess 26 is formed of the second semiconductor wafer layer 20 and encloses, for example, an angle of about 45° with the main extension plane.

In contrast to the radiation-emitting semiconductor chip 1 according to FIGS. 1, 2 and 3, the substrate 6 of the radiation-emitting semiconductor chip 1 to be produced has a structured main surface 22. The structured main surface 22 of the substrate 6 faces a main surface of the semiconductor layer sequence 2 being formed as a radiation exit surface 23 of the semiconductor layer sequence 2.

The radiation-emitting semiconductor chip 1 according to the exemplary embodiment of FIG. 5 is provided in the main region 13 with at least two contacts 24 configured to be externally electrically contactable.

The contacts 24 are in electrical contact with the semiconductor layer sequence 2 and are configured to provide power to the semiconductor layer sequence 2.

The features and exemplary examples described in connection with the Figures can be combined with one another according to further exemplary examples, even if not all combinations are explicitly described. Furthermore, the exemplary examples described in connection with the Figures can alternatively or additionally have further features as described in the general part of the description.

The invention is not limited to the exemplary examples by the description based on the exemplary examples. Rather, the invention comprises any new feature as well as any combination of features, which includes in particular any combination of features in the claims, even if this feature or combination itself is not explicitly stated in the claims or exemplary examples.

REFERENCES

1 radiation-emitting semiconductor chip
2 semiconductor layer sequence
3 first semiconductor layer
4 second semiconductor layer
5 active region
6 substrate
7 first dielectric layer
8 second dielectric layer
9 third dielectric layer
10 first recess
11 border region
12 edge region
13 main region
14 separation region
15 central region
16 second recess
17 sublayer
18 semiconductor wafer
19 first semiconductor wafer layer
20 second semiconductor wafer layer
21 side surface radiation-emitting semiconductor chip
22 structured main surface
23 radiation exit surface
24 contact
25 first separation recess
26 second separation recess

The invention claimed is:

1. A radiation-emitting semiconductor chip comprising:
- a semiconductor layer sequence comprising a first semiconductor layer of a first doping type and a second semiconductor layer of a second doping type;
- a first dielectric layer and a second dielectric layer arranged on the semiconductor layer sequence;

wherein:
- a first recess is arranged in the semiconductor layer sequence in a border region of the radiation-emitting semiconductor chip completely penetrating the first semiconductor layer,
- the first dielectric layer covers the semiconductor layer sequence in the border region completely, and
- the border region is free of the second dielectric layer in an edge region, wherein the second dielectric layer comprises a plurality of sublayers on a side surface of the semiconductor layer sequence and layer thicknesses of the sublayers are tapered in the border region in direction to the edge region; and a third dielectric layer arranged between the second dielectric layer and the semiconductor layer sequence, wherein the first dielectric layer is in direct contact with a top surface of the third dielectric layer in the edge region.

2. The radiation-emitting semiconductor chip according to claim 1, wherein:
- the semiconductor layer sequence is configured to emit electromagnetic radiation from a radiation exit surface, and
- the first dielectric layer and the second dielectric layer are arranged opposite the radiation exit surface.

3. The radiation-emitting semiconductor chip according to claim 1, wherein the second dielectric layer is a distributed Bragg reflector.

4. The radiation-emitting semiconductor chip according to claim 1, wherein the first dielectric layer and the third dielectric layer have a combined thickness of at most 3 μm.

5. The radiation-emitting semiconductor chip according to claim 1, wherein the semiconductor layer sequence is arranged on a substrate.

6. The radiation-emitting semiconductor chip according to claim 5, wherein the substrate has a structured main surface.

7. The radiation-emitting semiconductor chip according to claim 1, wherein a second recess completely penetrates the second semiconductor layer, wherein a lateral extent that defines the second recess is completely within a lateral extent that defines the first recess.

8. The radiation-emitting semiconductor chip according to claim 1, wherein the side surface of the second dielectric layer is inclined with respect to a main extension plane of the radiation-emitting semiconductor chip.

9. The radiation-emitting semiconductor chip according to claim 1, wherein the second dielectric layer comprises a plurality of sublayers and layer thicknesses of the sublayers in the border region are constant in direction to the edge region.

10. The radiation-emitting semiconductor chip according to claim 1, wherein the radiation-emitting semiconductor chip is a flip chip.

11. A method for producing a radiation-emitting semiconductor chip, wherein the method comprises:
- providing a semiconductor wafer comprising a first semiconductor wafer layer of a first doping type and a second semiconductor wafer layer of a second doping type;
- producing a first separation recess within the semiconductor wafer in a separation region completely penetrating the first semiconductor wafer layer;
- applying a first dielectric layer on the semiconductor wafer such that the first dielectric layer completely covers the semiconductor wafer in the separation region;
- applying a second dielectric layer on the semiconductor wafer such that the separation region is free of the second dielectric layer in a central region, wherein the second dielectric layer comprises a plurality of sublayers on a side surface of the semiconductor layer sequence and layer thicknesses of the sublayers are tapered in a border region in direction to an edge region;
- applying a third dielectric layer between the second dielectric layer and the semiconductor wafer, wherein the first dielectric layer is in direct contact with a top surface of the third dielectric layer in the edge region; and
- separating the semiconductor wafer through the central region into radiation emitting semiconductor chips.

12. The method according to claim 11, wherein the second dielectric layer is applied on the separation region completely, and the second dielectric layer is removed from the separation region in the central region.

13. The method according to claim 12, wherein the second dielectric layer is removed from the separation region in the central region by an etching process.

14. The method according to claim 12, wherein the second dielectric layer is removed by a lift-off process.

15. The method according to claim 11, wherein the semiconductor wafer is separated by a stealth dicing process.

* * * * *